US011183561B2

(12) United States Patent
Cheng et al.

(10) Patent No.: US 11,183,561 B2
(45) Date of Patent: Nov. 23, 2021

(54) NANOSHEET TRANSISTOR WITH INNER SPACERS

(71) Applicant: International Business Machines Corporation, Armonk, NY (US)

(72) Inventors: Kangguo Cheng, Schenectady, NY (US); Ruilong Xie, Niskayuna, NY (US); Chanro Park, Clifton Park, NY (US); Juntao Li, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/735,972

(22) Filed: Jan. 7, 2020

(65) Prior Publication Data

US 2021/0210598 A1 Jul. 8, 2021

(51) Int. Cl.
| | |
|---|---|
| *H01L 29/06* | (2006.01) |
| *H01L 21/02* | (2006.01) |
| *H01L 21/306* | (2006.01) |
| *H01L 21/84* | (2006.01) |
| *H01L 29/08* | (2006.01) |

(Continued)

(52) U.S. Cl.
CPC .... *H01L 29/0673* (2013.01); *H01L 21/02603* (2013.01); *H01L 21/30604* (2013.01); *H01L 21/84* (2013.01); *H01L 29/0649* (2013.01); *H01L 29/0847* (2013.01); *H01L 29/1033* (2013.01); *H01L 29/6653* (2013.01); *H01L 29/6656* (2013.01); *H01L 29/66545* (2013.01); *H01L 29/66553* (2013.01); *H01L 29/66666* (2013.01)

(58) Field of Classification Search
CPC ........ H01L 21/02603; H01L 21/30604; H01L 21/84; H01L 29/0649; H01L 29/0653; H01L 29/0673; H01L 29/0847; H01L 29/1033; H01L 29/42392; H01L 29/6653; H01L 29/66545; H01L 29/66553; H01L 29/6656; H01L 29/66666; H01L 29/775; H01L 29/78696
See application file for complete search history.

(56) References Cited

U.S. PATENT DOCUMENTS

| | | | |
|---|---|---|---|
| 9,923,055 B1 | 3/2018 | Cheng et al. | |
| 10,008,583 B1 * | 6/2018 | Rodder | H01L 29/42392 |

(Continued)

*Primary Examiner* — David C Spalla
(74) *Attorney, Agent, or Firm* — Robert Sullivan; Ryan, Mason & Lewis, LLP

(57) ABSTRACT

A method includes forming a stacked nanosheet structure on a semiconductor substrate. The stacked nanosheet structure includes a plurality of alternating sacrificial nanosheets and channel nanosheets. The method further includes forming a dummy gate structure about the stacked nanosheet structure. The method also includes removing outer surface regions of the sacrificial nanosheets to define an at least partial recess at each outer surface region and forming an inner spacer within each of the at least partial recesses. The method also includes forming an isolation layer adjacent at least outer surface regions of at least the channel nanosheets. The method further includes forming a source region and a drain region about the stacked nanosheet structure. The method also includes removing the sacrificial nanosheets through an etching process whereby the isolation layer and the inner spacers isolates the source and drain regions from the etching process.

20 Claims, 16 Drawing Sheets

(51) Int. Cl.
H01L 29/10  (2006.01)
H01L 29/66  (2006.01)

(56) References Cited

U.S. PATENT DOCUMENTS

| | | |
|---|---|---|
| 10,014,390 B1 | 7/2018 | Bouche et al. |
| 10,170,584 B2 | 1/2019 | Guillorn et al. |
| 10,243,043 B2 | 3/2019 | Mochizuki et al. |
| 10,325,983 B2 | 6/2019 | Chang et al. |
| 10,529,830 B2 * | 1/2020 | Tapily ............... B82Y 10/00 |
| 2016/0365411 A1 * | 12/2016 | Yeh ................. H01L 29/0673 |
| 2019/0058052 A1 * | 2/2019 | Frougier ........... H01L 29/6653 |
| 2019/0131415 A1 | 5/2019 | Cheng et al. |
| 2019/0181224 A1 | 6/2019 | Zhang et al. |
| 2019/0198616 A1 * | 6/2019 | Coquand ............ B82Y 10/00 |
| 2019/0198645 A1 | 6/2019 | Cheng et al. |
| 2019/0221483 A1 | 7/2019 | Mulfinger et al. |

* cited by examiner

NANOSHEET TRANSISTOR WITH INNER SPACERS

BACKGROUND

The present application relates to manufacturing of semiconductor integrated circuits, and, more particularly, relates to formation of field effect transistor (FET) devices in integrated circuits. Continued innovations in semiconductor process technologies are enabling higher integration densities and associated device scaling. As the semiconductor industry moves towards the 5 nanometer (nm) production node and beyond, FET devices must be scaled to smaller dimensions to provide an increased effective channel width per footprint area. Such scaling in some cases is achieved using nanosheet FET devices. A given nanosheet FET device comprises a channel which includes multiple nanosheet layers arranged in a stacked configuration, with each nanosheet layer having a vertical thickness that is substantially less than its width. A common gate structure is formed in areas above and below the nanosheet layers in the stacked configuration, thereby increasing the effective channel width of the resulting device, and thus the drive current supported thereby, for a given footprint area. Nanosheet technologies are considered to be a viable option for continued scaling of metal-oxide-semiconductor (MOS) devices, such as complementary MOS (CMOS) devices each comprising an N-type FET (nFET) and a P-type FET (pFET). However, problems can arise in the production of nanosheet device features, particularly, at production nodes below 5 nm. For example, one challenge of fabricating nanosheet FET devices is isolating the source and drain regions during etching and removal of one or more layers of the nanosheet FET device to prevent or minimize degradation of these regions.

SUMMARY

Accordingly, illustrative embodiments of the present disclosure are directed to processes and techniques for use in fabrication of nanosheet FET structures.

In accordance with one illustrative embodiment, a method comprises forming a stacked nanosheet structure on a semiconductor substrate. The stacked nanosheet structure comprises a plurality of alternating sacrificial nanosheets and channel nanosheets. The method further comprises forming a dummy gate structure about the stacked nanosheet structure. The method also comprises removing outer surface regions of the sacrificial nanosheets to define an at least partial recess at each outer surface region. An inner spacer is formed within each of the at least partial recesses of the sacrificial nanosheets. The method further comprises forming an isolation layer adjacent at least outer surface regions of at least the channel nanosheets. Source and drain regions are formed about the stacked nanosheet structure. The method further comprises at least partially removing the sacrificial nanosheets through an etching process whereby the isolation layer and the inner spacers isolate the source and drain regions from the etching process.

In another illustrative embodiment, a method comprises forming a stacked nanosheet structure on a semiconductor substrate. The stacked nanosheet structure comprises a plurality of alternating sacrificial nanosheets and channel nanosheets. A dummy gate structure is formed about the stacked nanosheet structure. The method further comprises depositing a spacer within recesses adjacent the outer surface regions of the sacrificial nanosheets. The method also comprises removing material within the outer surface regions of the sacrificial nanosheet to define a gap between each spacer and the sacrificial nanosheets. An isolation layer is epitaxially grown within the gaps defined between the spacers and adjacent outer surface regions of the channel nanosheets. The method further comprises forming a source region and a drain region about the stacked nanosheet structure. The dummy gate is removed. The sacrificial nanosheets are then removed through an etching process whereby at least the isolation material isolates the source region and the drain region from the etching process to provide a nanosheet transistor structure. The method further comprises forming a functional gate structure in a void created by removal of the dummy gate.

In yet another illustrative embodiment, a semiconductor structure comprises a nanosheet structure on a semiconductor substrate. The nanosheet structure comprises a plurality of channel nanosheets. Source and drain regions are disposed about the nanosheet structure. An isolation layer is disposed between the nanosheets and the source and drain regions. A functional gate structure is disposed about the nanosheet structure.

These and other objects, features and advantages of the present disclosure will become apparent from the following detailed description of illustrative embodiments thereof, which is to be read in connection with the accompanying drawings.

DETAILED DESCRIPTION

Figure 1:
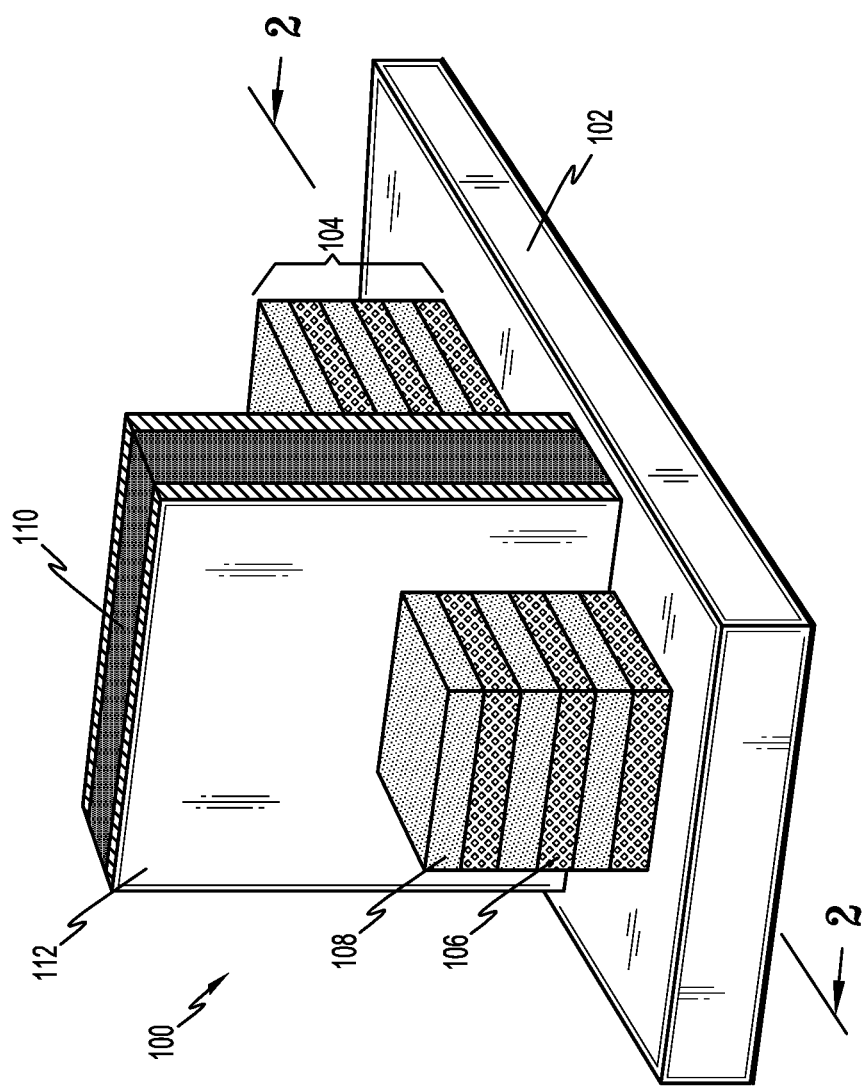
FIG. 1 is a perspective view of a semiconductor structure illustrating a semiconductor substrate, a nanosheet stack disposed on the substrate and a dummy gate with a gate spacer according to one or more illustrative embodiments.

The processes disclosed herein provide an isolation structure in a nanosheet FET transistor. The isolation structure is composed of inner spacers and an epitaxially grown isolation layer which cooperate to impede the migration of etchants, utilized in an etch process for removal of sacrificial material, to surrounding source and drain regions.

It is understood in advance that although this description includes a detailed description of an illustrative nanosheet FET architecture having channel nanosheets and sacrificial nanosheets, implementation of the teachings recited herein are not limited to the particular FET architecture described herein. Rather, embodiments of the present invention are capable of being implemented in conjunction with any other type of FET device, including, for example, any p-type or n-type nanosheet FET architectures and transistor structures.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto a semiconductor device. Available technologies include physical vapor deposition (PVD), chemical vapor deposition (CVD), electrochemical deposition (ECD), molecular beam epitaxy (MBE) and, more recently, atomic layer deposition (ALD) among others. Removal/etching is any process that removes material from the semiconductor structure. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to an underlying substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the substrate, for example, a wafer, is aligned to the previously formed patterns and slowly the conductors, insulators and selectively doped regions are built up to form the final device.

The various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, e.g., film deposition, removal/etching, semiconductor doping, patterning/lithography and annealing steps, are purposefully not described in great detail herein for economy of description.

Moreover, the same or similar reference numbers are used throughout the drawings to denote the same or similar features, elements, or structures, and thus, a detailed explanation of the same or similar features, elements, or structures will not be repeated for each of the drawings. The terms "about" or "substantially" as used herein with regard to thicknesses, widths, percentages, ranges, etc., are meant to denote being close or approximate to, but not exactly. For example, the term "about" or "substantially" as used herein implies that a small margin of error is present. Further, the terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or Y-direction of the Cartesian coordinates shown in the drawings.

Additionally, the term "illustrative" is used herein to mean "serving as an example, instance or illustration." Any embodiment or design described herein is intended to be "illustrative" and is not necessarily to be construed as preferred or advantageous over other embodiments or designs. The term "connection" can include both an indirect "connection" and a direct "connection." The terms "on" or "onto" with respect to placement of components relative to the semiconductor structure are not to be interpreted as requiring direct contact of the components for it is possible one or more intermediate components, layers or coatings may be positioned between the select components unless otherwise specified. More specifically, positional relationships, unless specified otherwise, can be direct or indirect, and the present disclosure is not intended to be limiting in this respect.

As previously noted herein, for the sake of brevity, conventional techniques related to semiconductor device and integrated circuit (IC) fabrication may or may not be described in detail herein. Although specific fabrication operations used in implementing one or more embodiments of the present disclosure can be individually known, the described combination of operations and/or resulting structures of the present disclosure are unique. Thus, the unique combination of the operations described in connection with the fabrication of a semiconductor structure including a nanosheet FET transistor structure or device according to illustrative embodiments utilize a variety of individually known physical and chemical processes performed on a semiconductor (e.g., silicon) substrate, some of which are described in the immediately following paragraphs.

In the discussion that follows, the semiconductor device, which will incorporate one or more nanosheet FET transistor structures or devices, will be referred to as the "semiconductor structure 100" throughout the various stages of fabrication, as represented in all the accompanying drawings. In addition, the following discussion will identify various intermediate stages of fabrication of the semiconductor structure 100. It is to be understood that the intermediate stages are exemplative only. More or less intermediate stages may be implemented in processing the semiconductor structure 100, and the disclosed stages may be in different order or sequence. In addition, one or more processes may be incorporated within various intermediate stages as described herein, and one or more processes may be implemented in intermediate stages as otherwise described herein.

FIGS. 1-13 illustrate a manufacturing or fabrication process for one illustrative embodiment of a semiconductor structure 100 involving the formation of n-type or p-type stacked nanosheet of respective nFET and pFET transistors of, for example, a CMOS device according to one illustrative embodiment of the present disclosure. In the embodiments illustrated in FIGS. 1-13, a single fin nanosheet transistor structure is fabricated onto a substrate and/or wafer. The single fin nanosheet transistor structure is, in illustrative embodiments a p-type stacked nanosheet transistor structure; however, the principles described herein may be readily applied to an n-type stacked nanosheet transistor structure. The process is applied to the semiconductor structure 100 in conjunction with the manufacture of integrated circuits. FIGS. 2-13 illustrate respective cross-sectional views of at least a portion of the semiconductor structure 100 as it undergoes sequential processing operations as part of the process. It is to be appreciated that the various elements and other features shown in these figures are simplified for clarity and simplicity of illustration and are not necessarily drawn to scale.

Figure 2:
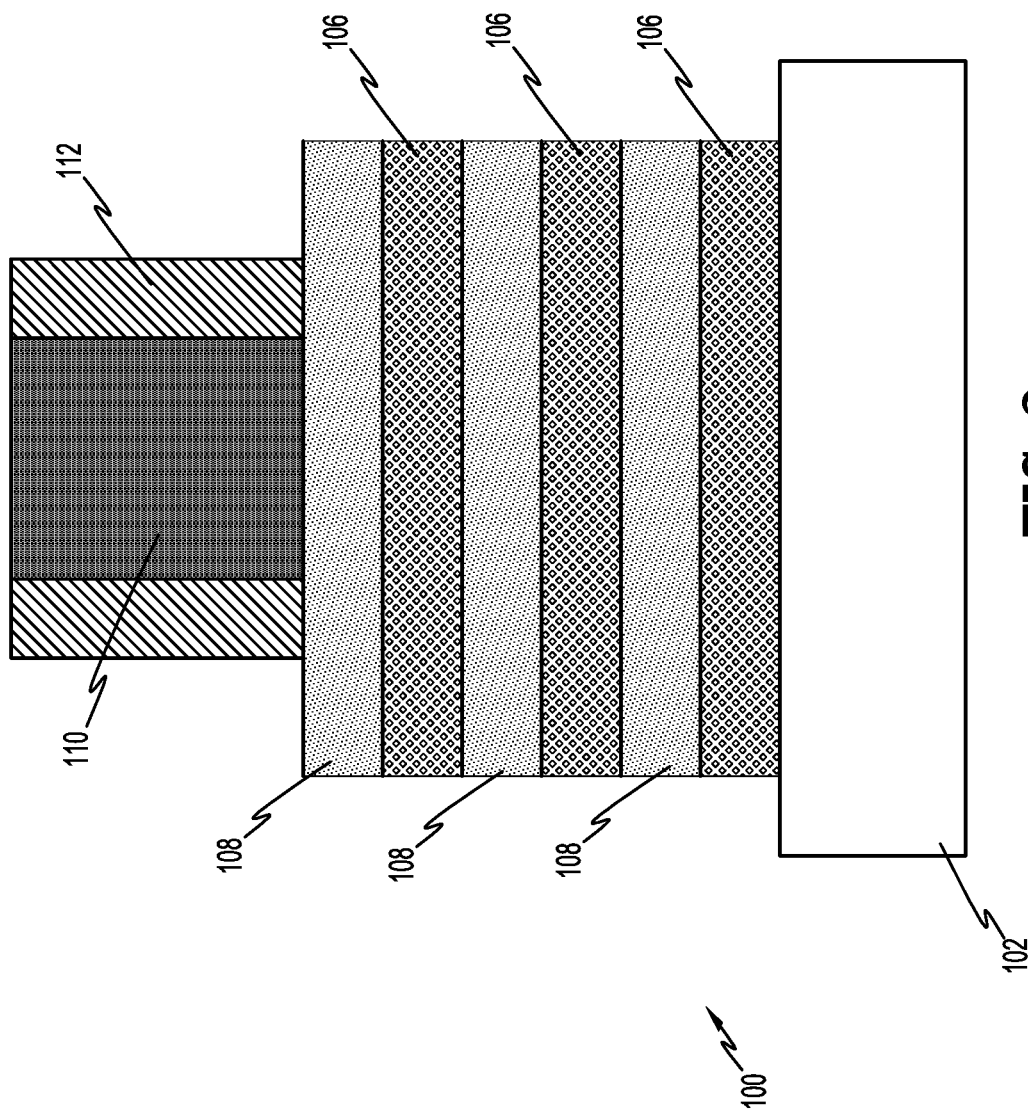
FIG. 2 is a cross-sectional view of the semiconductor structure taken along the lines 2-2 of FIG. 1 illustrating the alternating arrangement of the channel nanosheets and the sacrificial nanosheets of the nanosheet stack on the semiconductor substrate and the dummy gate with the gate spacer according to one or more illustrative embodiments.

FIG. 1 is a perspective view of the semiconductor structure and FIG. 2 is a cross-sectional view of the semiconductor structure 100 along lines 2-2 of FIG. 1. The semiconductor substrate 100 includes a substrate or wafer 102 and a nanosheet stack 104 formed on the substrate 102. The substrate 102 may include an oxide layer (not specifically shown) upon which the nanosheet stack 104 is formed. The substrate 102 may include a silicon (Si) material or other dielectric material, such as silicon oxide or silicon nitride. In illustrative embodiments, the substrate 102 may have a thickness of about 500 to 1000 micrometers (μm). The substrate 102 may itself comprise multiple layers, although it is shown as a single layer in the figures, again for clarity and simplicity of illustration.

The nanosheet stack 104 is formed as an alternating series of sacrificial nanosheets 106 and channel nanosheets 108. In illustrative embodiments, the sacrificial nanosheets 106 comprise silicon-germanium (SiGe) and the channel nanosheets 108 comprise silicon (Si). Other materials for the sacrificial nanosheets 106 and the channel nanosheets 108 are also contemplated. The sacrificial nanosheets 106 are "sacrificial" meaning they are substantially removed in subsequent processing steps. The channel nanosheets 108 will be the nanosheet layers of a nanosheet channel transistor structure. Although the nanosheet stack 104 is shown as including three sacrificial nanosheets 106 and three channel nanosheets 108, it should be understood that in other illustrative embodiments any number of sacrificial nanosheets 106 and channel nanosheets 108 may be used. In addition, any semiconductor material composition may be used for the sacrificial nanosheets 106 and the channel nanosheets 108 so long as at least one of the compositions selected allow for selective etching between at least two of them. More specifically, any type IV semiconductor composition combination and/or III-V semiconductor composition combination may be suitable. In addition, the thickness of the sacrificial nanosheets 106 are shown as being substantially equal. However, it is to be appreciated that the thicknesses of the sacrificial nanosheets 106 may vary with, for example, the lowermost sacrificial nanosheet proximate the substrate 102 being thicker than the remaining two sacrificial nanosheets 106. In illustrative embodiments, the thickness of the sacrificial nanosheets 106 and the channel nanosheets 108 may range from about 3 nanometer (nm) to about 30 nanometers (nm), and more particularly, may range from about 5 nanometers (nm) to about 20 nanometers (nm).

The sacrificial nanosheets 106 and the channel nanosheets 108 may be epitaxially grown in an alternating fashion in accordance with conventional methodologies. For example, the alternating series of silicon germanium (SiGe) sacrificial nanosheets 106 and silicon (Si) channel nanosheets 108 may be formed by epitaxially growing one layer and then the next until the desired number and desired thicknesses of the sacrificial and channel nanosheets 106, 108 are achieved. Epitaxial materials can be grown from gaseous or liquid precursors, and may be grown using vapor-phase epitaxy (VPE), molecular-beam epitaxy (MBE), liquid-phase epitaxy (LPE), or other suitable process. Epitaxial silicon (Si), silicon germanium (SiGe), and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. In illustrative embodiments, p-type dopants are added to eventually produce a pFET nanosheet transistor structure.

With continued reference to FIGS. 1 and 2, a dummy gate 110 is formed on the uppermost sacrificial nanosheet 106, and along the sidewalls of the nanosheet stack 104 although not visible in the cross-sectional view of FIG. 2. The dummy gate 110 is a placeholder that is subsequently removed and replaced with suitable gate materials to form a functional gate structure. The dummy gate 110 may comprise any material that can be etched selectively to the materials of the sacrificial nanosheets 106 and the channel nanosheets 108. One suitable material for the dummy gate 110 includes a silicon material, such as polysilicon, or any dielectric material such as an oxide, nitride or oxynitride material, or amorphous silicon. The dummy gate 110 may be formed using deposition (e.g., chemical vapor deposition), photolithography and etching processes (e.g., reactive ion etching). A hard mask layer (not specifically shown but incorporated as part of the structure of the dummy gate 110) may be formed on top of the dummy gate 110. The hard mask layer may be formed of any suitable material, e.g., a silicon nitride (SiN) hard mask material, that has an etch resistance greater than that of the substrate 102 and at least some of the insulator materials used in the remainder of the processing of the semiconductor structure 100. The hard mask material is used to cover/protect the nanosheet stack 104 during subsequent etching processes.

A gate spacer 112 is formed around the dummy gate 110 (and around the hard mask), and extends above and along the sides of the nanosheet stack as best depicted in FIG. 1. The gate spacer 112 may comprise a dielectric material, such as silicon boron carbide nitride (SiBCN), an oxide, nitride, silicon nitride (SiN), silicon oxide ($SO_2$) or other materials including low-k materials. In illustrative embodiments, the gate spacer 112 comprises silicon boron carbide nitride (SiBCN). The gate spacer 112 may be formed using a deposition process, such as chemical vapor deposition (CVD), and a reactive-ion etching (ME) process. The gate spacer 112 may be present on the sidewalls of the dummy gate 110, and may have a wall thickness ranging from about 3 nanometer (nm) to about 15 nanometers (nm).

Figure 3:
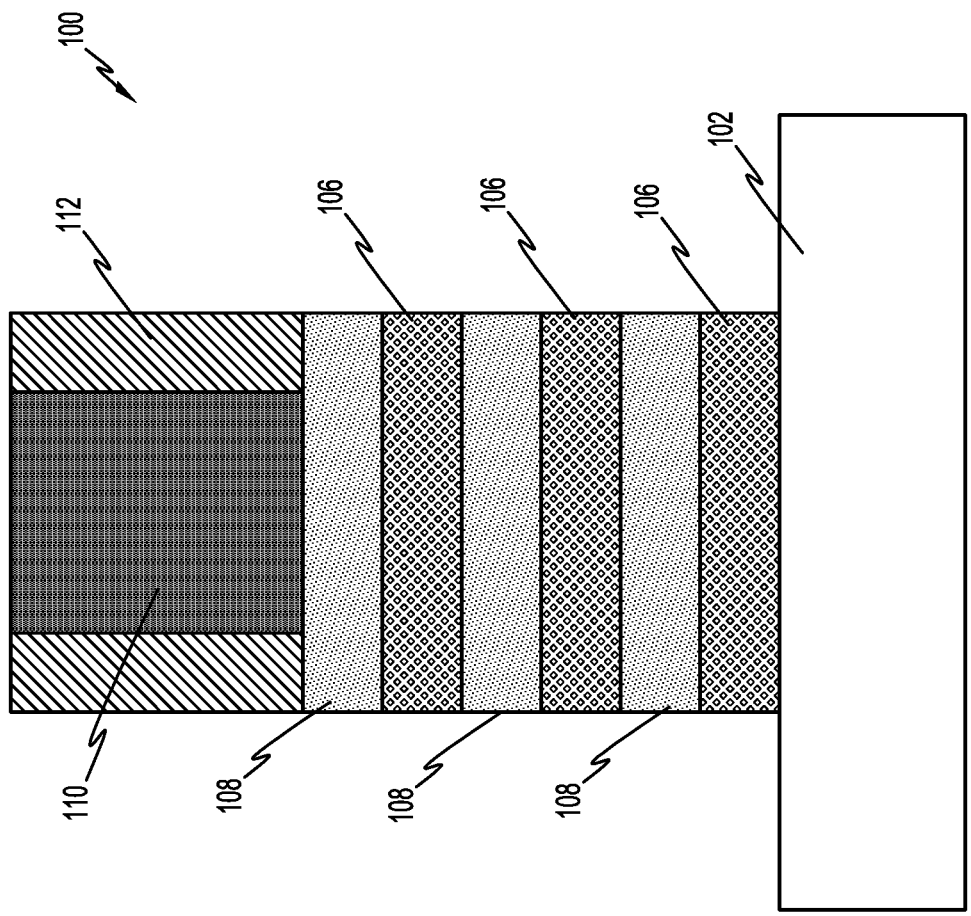
FIG. 3 is a cross-sectional view of the semiconductor structure illustrating the nanosheet stacks, the dummy gate and the gate spacer subsequent to an etching process according to one or more illustrative embodiments.

Referring now to FIG. 3, the process is continued by recessing the nanosheet stack 104 until the entirety of the portions of the stack 104 that extend beyond the outer sidewall of the dummy gate 110 and the gate spacer 112 are removed. In an illustrative embodiment, one or more etching processes are used including, for example, an anisotropic etch process. The term "anisotropic etch process" denotes a material removal process in which the etch rate in the direction normal to the surface to be etched is greater than in the direction parallel to the surface to be etched. The anisotropic etch may include reactive-ion etching (ME). Other examples of anisotropic etching that can be used at this point of the present disclosure include ion beam etching, plasma etching or laser ablation. In illustrative embodiments, the etch process for etching the nanosheet stack 104 is a timed etch.

In illustrative embodiments, the etch process for removing the portion of the nanosheet stack 104 that extends beyond the outer sidewall of the gate spacer 112 may be a selective etch process. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 10:1 or greater, e.g., 1000:1. For example, one or more etch processes may remove the exposed silicon-germanium (SiGe) material of the sacrificial nanosheets 106 and the exposed silicon (Si) material of the channel nanosheets 108, selectively to at least one of the materials of the gate spacer 112, the dummy gate 110 and the substrate 102. In some embodiments, an etch block mask, such as a photoresist or hard mask, e.g., silicon nitride (SiN) mask, may be formed over the dummy gate 110 during the etch process for removing the exposed portions of the nanosheet stack 104.

Figure 4:
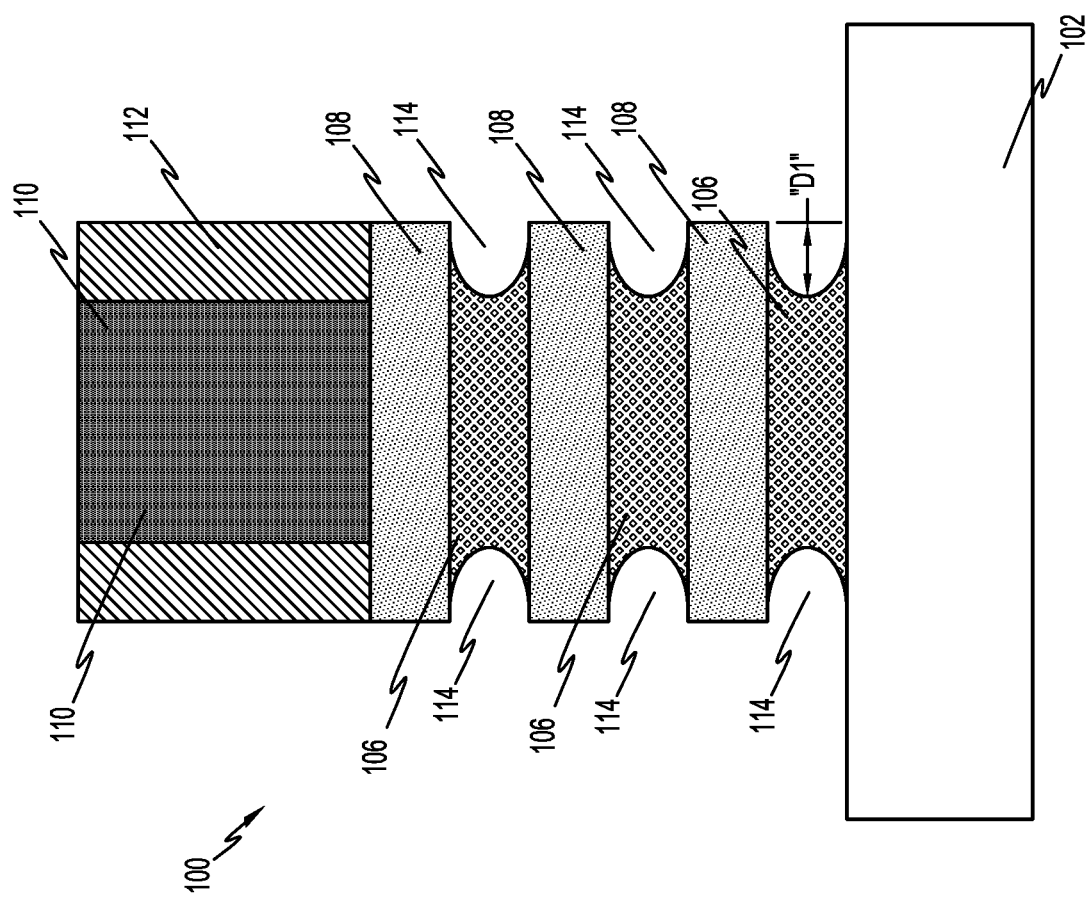
FIG. 4 is a cross-sectional view of the semiconductor structure illustrating the sacrificial nanosheets with lateral recesses subsequent to one or more etching processes according to one or more illustrative embodiments.

Referring now to FIG. 4, the lateral exposed surfaces of the sacrificial nanosheets 106 are subjected to an etch process, for example, a lateral hydrogen chloride (HCl) gas isotropic etch process, or an aqueous etch comprising hydrogen peroxide and ammonia, selective to the channel nanosheets 108, to create a plurality of lateral etches or undercut etches within the gate spacer 112 and the sacrificial nanosheets 106 to form sacrificial recesses 114 extending into the outer surfaces of the sacrificial nanosheets 106 to a depth "D1." The sacrificial recesses 114 are generally arcuate, crescent or half-moon shaped in profile and may extend to the inner wall of the gate spacer 112. The half-moon shape of the sacrificial recesses 114 is not an ideal configuration during etching removal of the sacrificial nanosheets 106 in the presence of the adjacent epitaxial grown source/drain regions. For example, the tips of the remaining sacrificial nanosheets 106 may connect to the later formed epitaxial source/drain regions. When the sacrificial nanosheets 106, for example, the silicon germanium (SiGe) material, are removed later in the process, the etchant could breach through the tips of the remaining sacrificial nanosheets 106 and undesirably etch the epitaxially source/drain regions, for example, SiGe for a pFET.

The process is continued by depositing a conformal dielectric layer (not shown) over the semiconductor structure 100 including at least the nanosheet stack 104. The conformal dielectric layer fills the sacrificial recesses 114. The term "conformal" denotes a layer having a thickness that does not deviate from greater than or less than 30% of an average value for the thickness of the layer. In particular, the conformal dielectric layer forms inner spacers 116 within the sacrificial recesses 114. The conformal deposition can be atomic layer deposition (ALD) or chemical vapor deposition (CVD), or any other suitable processes. Atomic Layer Deposition (ALD) uses self-limiting surface reactions to deposit material layers in the monolayer or sub-monolayer thickness regime. In some embodiments, the atomic layer deposition (ALD) process may be a thin film deposition method in which a film is grown on a substrate by exposing its surface to alternate gaseous species (typically referred to as precursors). The deposition provided by the atomic layer deposition mechanism provides that the layer be conformal whereby the sacrificial recesses 114 are filled with a dielectric material. In illustrative embodiments, the atomic layer deposited (ALD) conformal dielectric layer comprises depositing an oxide, nitride or oxynitride material layer. For example, the atomic layer deposited conformal dielectric layer may be composed of silicon nitride (SiN), or silicon oxynitride, e.g., SiOxNy. Any material that is suitable for deposition using atomic layer deposition (ALD) or chemical vapor deposition (CVD) methods may also be suitable for use with the methods and structures of the present disclosure so long as being suitable for filling the sacrificial recesses 114.

Figure 5:
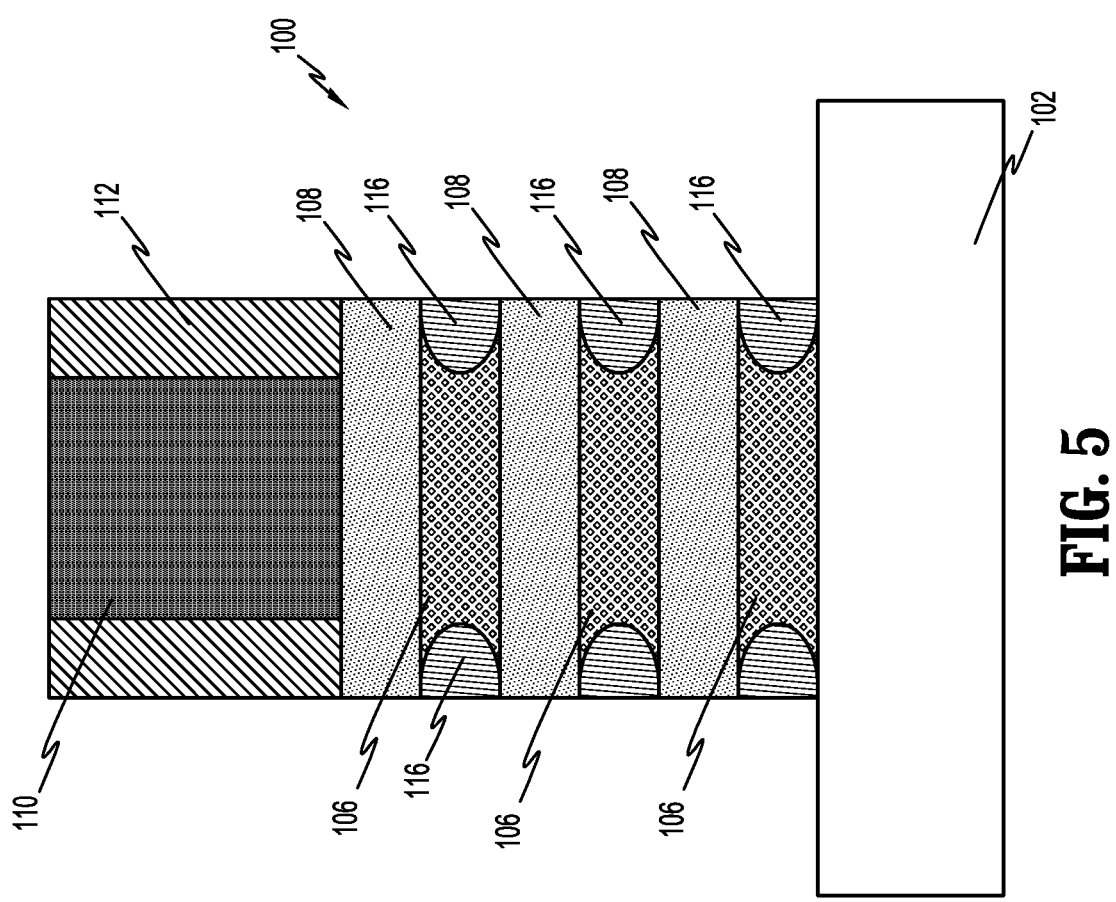
FIG. 5 is a cross-sectional view of the semiconductor structure illustrating formation of inner spacers within the lateral recesses of the sacrificial nanosheets according to one or more illustrative embodiments.

FIG. 5 illustrates the semiconductor structure subsequent to one or more etching processes which removes excess conformal dielectric layer. As depicted in FIG. 5, subsequent to etching, inner spacers 116 of the conformal dielectric layer remain to fill the sacrificial recesses 114. The inner spacers 116 separate the adjacent channel nanosheets 108, and in combination with the gate spacer 112 form, in illustrative embodiments, a composite spacer. The inner spacers 116, i.e., the portion of the conformal dielectric layer that fills the sacrificial recesses 114 may be referred to as a crescent shaped portion of the composite spacer.

Figure 6:
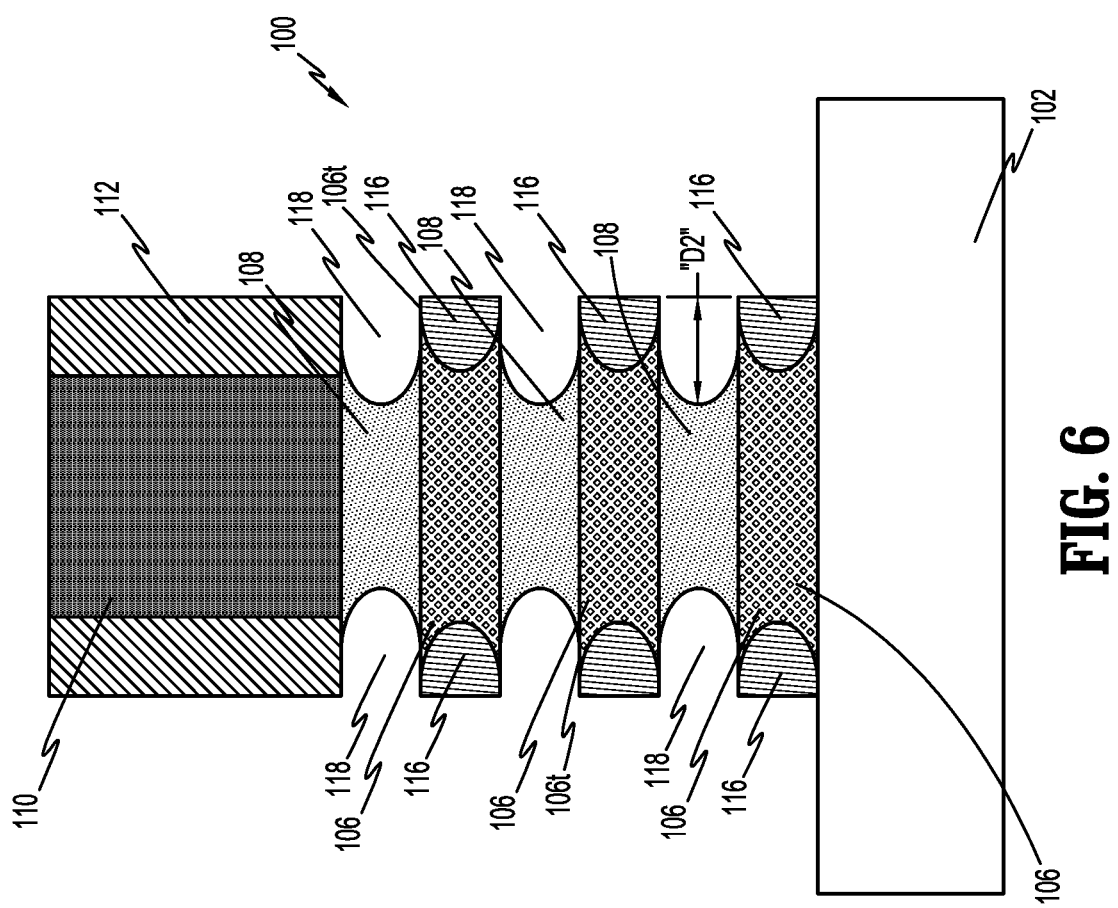
FIG. 6 is a cross-sectional view of the semiconductor structure illustrating formation of lateral recesses within the channel nanosheets according to one or more illustrative embodiments.

With reference to FIG. 6, the lateral exposed surfaces of the silicon channel nanosheets 108 are subjected to an etch process, selective to the sacrificial nanosheets 106 to create a plurality of lateral etches or undercut etches within the channel nanosheets 108 thereby forming lateral channel recesses 118 extending into the outer surfaces of the channel nanosheets 108 to a depth "D2." In illustrative embodiments, the channel recesses 118 are also crescent or half-moon shaped with each defining a depth "D2" which is greater than the depth "D1" of the of the previously formed sacrificial recesses 114 whereby outer peripheral tip segments 106t of the sacrificial nanosheets 106 are exposed, i.e., the channel recesses 118 extend radially inward to a greater extent than the sacrificial recesses 114 with inner portions of the channel recesses 118 potentially radial inward of the inner wall of the gate spacer 112.

Figure 7:
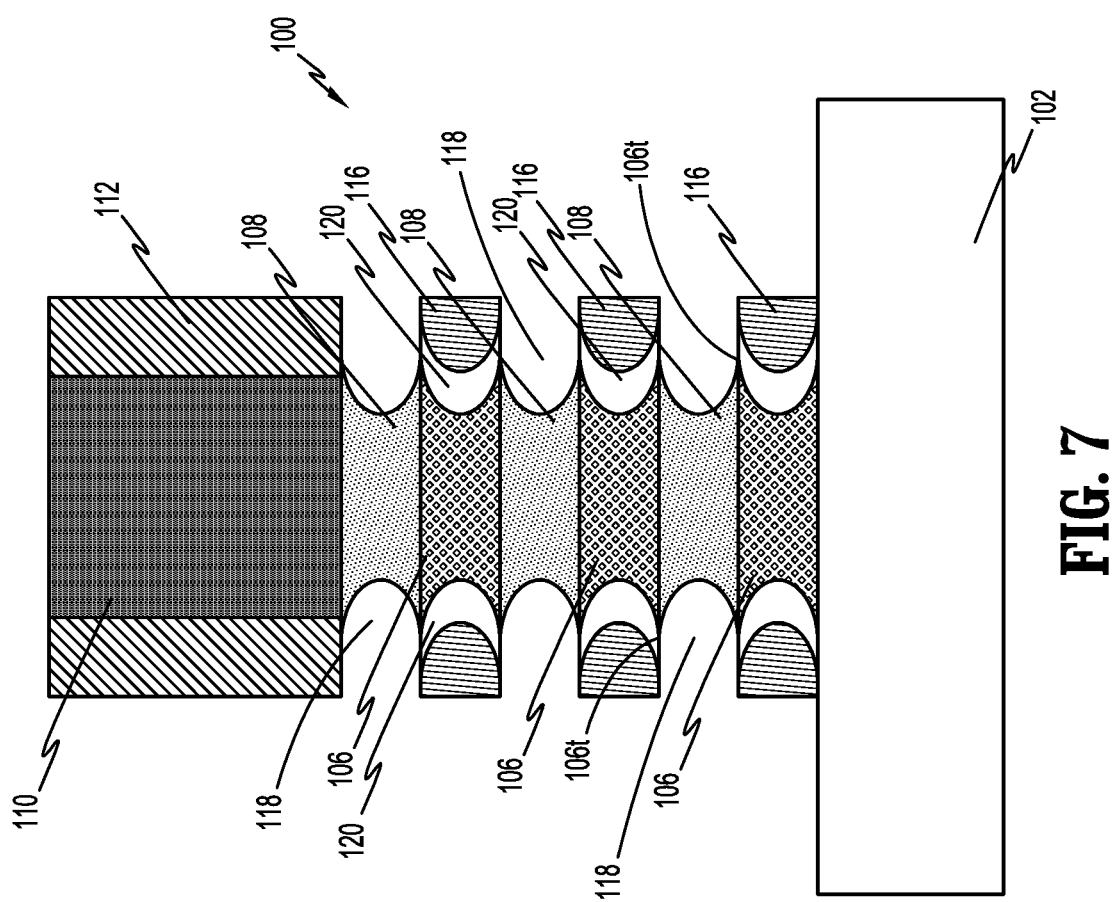
FIG. 7 is a cross-sectional view of the semiconductor structure illustrating formation of gaps between the inner spacers and the sacrificial nanosheets according to one or more illustrative embodiments.

Referring now to FIG. 7 the peripheral portions, optionally including the exposed tip segments 106t of the sacrificial nanosheets 106, are subjected to an isotropic etch process to further remove the silicon germanium (SiGe) material of the sacrificial nanosheets 106. The result is a gap 120 provided between each of the inner spacers 116 and the remaining portions of the sacrificial nanosheets 106. In illustrative embodiments, the thickness of the sacrificial nanosheets 106 is relatively small, for example, about 10 nanometers (nm); therefore, the etching process may be limited to a few nanometers (nm) to further remove portions of the sacrificial nanosheets 106. In this regard, the gaps 120 expose the silicon germanium (SiGe) material of the sacrificial nanosheets 106 at the interface of the silicon (Si) channel nanosheets 108 and the remaining portion of the sacrificial nanosheets. The inner spacers 116 may be held in place by the gate spacer 112 and/or the channel nanosheets 108.

Figure 8:
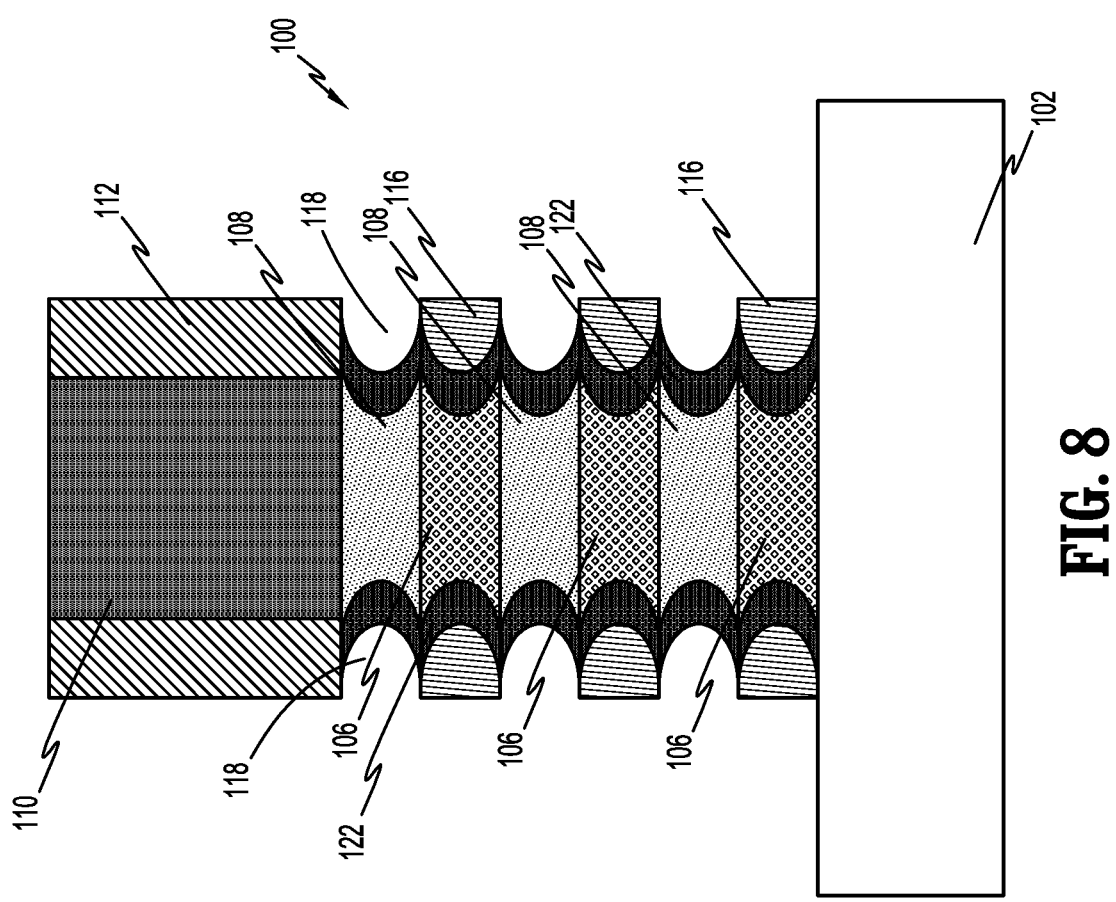
FIG. 8 is a cross-sectional view of the semiconductor structure illustrating formation of an isolation layer within the gaps between the inner spacers and the sacrificial nanosheets and along the recesses of channel nanosheets according to one or more illustrative embodiments.

With reference to FIG. 8, a dielectric is epitaxially grown within the gaps 120 to define an isolation layer 122. In one illustrative embodiment, the isolation layer 122 comprises silicon (Si) which is epitaxially grown via conventional methodologies such as vapor-phase epitaxy (VPE), molecular-beam epitaxy (MBE), liquid-phase epitaxy (LPE), etc., within the gaps 120 and within the channel recesses 118 of the channel nanosheets 108. The isolation layer 122 separates or isolates the sacrificial nanosheets 106, and thus prevents undesired loss of source/drain epitaxy material (particularly, SiGe source/drain regions for a pFET transistor structure) during subsequent etching processes of the SiGe material of the sacrificial nanosheets 106 in connection with release of the channel nanosheets 106 of the nanosheet stack 104.

Figure 9:
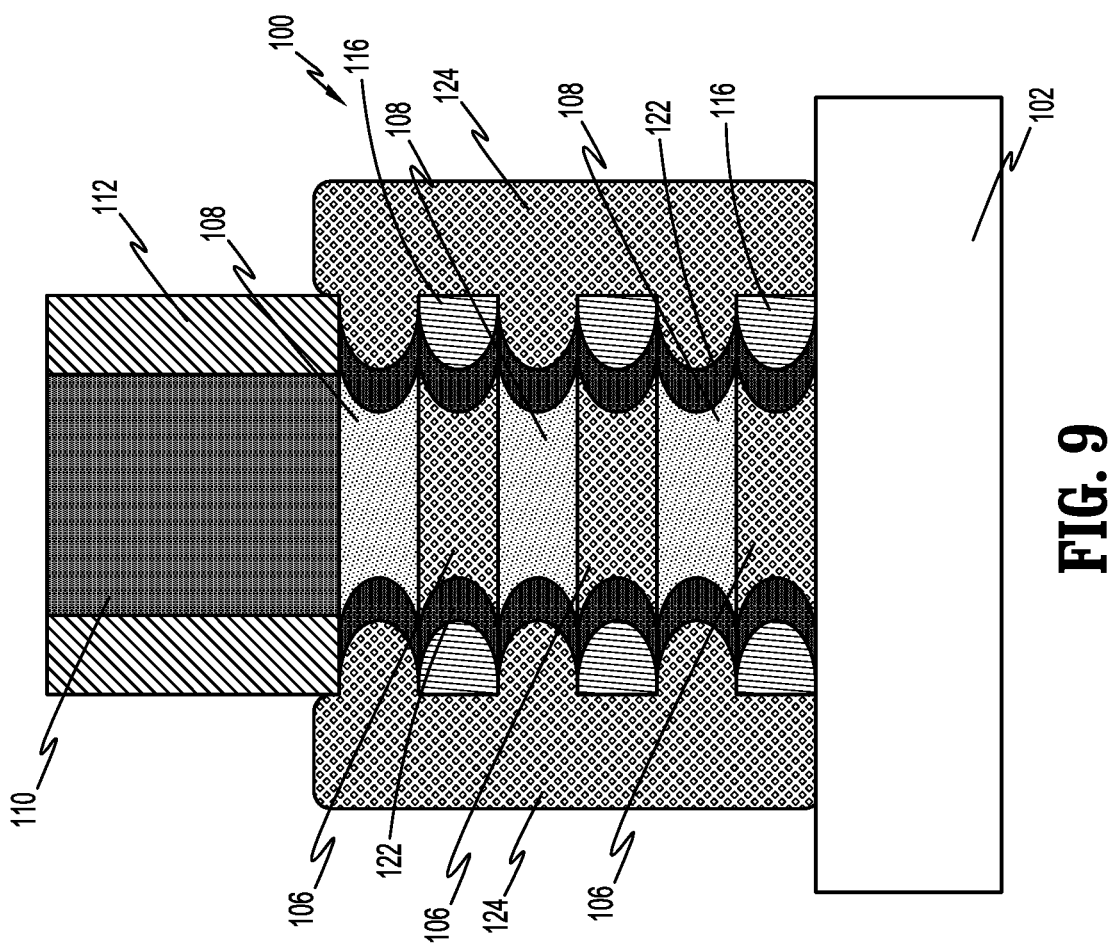
FIG. 9 is a cross-sectional view of the semiconductor structure illustrating formation of source and drain regions about the nanosheet stack according to one or more illustrative embodiments.

FIG. 9 depicts the semiconductor structure 100 after a next fabrication stage. As shown, source and drain (S/D) regions 124 are formed using an epitaxial layer growth process on the sidewalls of the nanosheet stack 104, the inner spacers 116 and the isolation layer 122. In illustrative embodiments, the S/D regions 124 comprise epitaxial growth of silicon germanium (SiGe) material similar to the material of the sacrificial nanosheets 106. Alternatively, the S/D regions 124 may include epitaxial growth of silicon. The epitaxial growth or layers may provide at least a portion of the S/D regions 124 of the semiconductor structure 100. As used herein, the term "drain" means a doped region in semiconductor structure located at the end of the channel region, in which carriers are flowing out of the semiconductor structure 100, e.g. nanosheet transistor structure, through the drain. The term "source" is a doped region in the semiconductor structure, in which majority carriers are flowing into the channel region. The S/D regions 124 may be formed by in-situ doping (doping during epitaxy) or ex-situ, or a combination of in-situ doping and ex-situ doping. Doping techniques may include but, are not limited to, ion implantation, gas phase doping, plasma doping, plasma immersion ion implantation, cluster doping, infusion doping, liquid phase doping, solid phase doping, and/or any suitable combination of those techniques. In some embodiments, dopants are activated by thermal annealing such as laser annealing, flash annealing, rapid thermal annealing (RTA) or any suitable combination of those techniques.

Epitaxial growth or deposition of the S/D regions 124 may be carried out in a chemical vapor deposition apparatus, such as a metal organic chemical vapor deposition (MOCVD) apparatus or a plasma enhanced chemical vapor deposition (PECVD) apparatus. The epitaxial semiconductor S/D regions 124 may be in situ doped to a p-type or n-type conductivity. The term "in situ" denotes that a dopant, e.g., p-type or n-type dopant, is introduced to the base semiconductor material, e.g., silicon (Si) or silicon germanium (SiGe), during the formation of the base material. In one illustrative embodiment, for a p-type conductivity, boron p-type dopants are introduced into the epitaxial growth of silicon germanium (SiGe) and, for an n-type conductivity, phosphorous n-type dopants are introduced into the epitaxial growth of silicon (Si). In the illustrative embodiment, the S/D regions 124 are fabricated from epi growth silicon germanium (SiGe) and are doped with p-type dopants to eventually form a pFET transistor structure. The growth of the isolation layer 122 and the growth of the S/D regions may be performed in two separate processes. Alternatively, the growth of the isolation layer 122 and the growth of the S/D regions 124 can be performed sequentially in the same epitaxy process.

Figure 10:
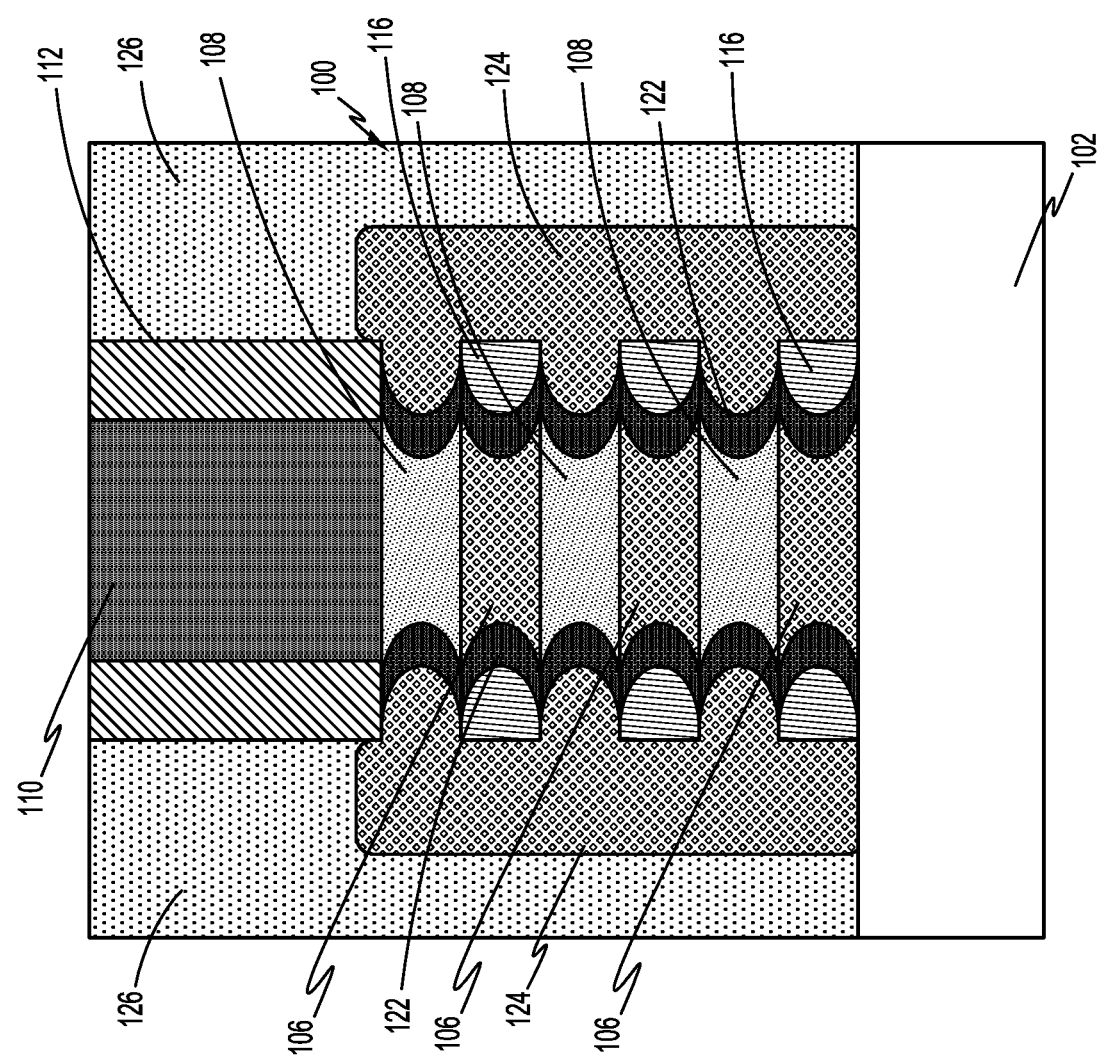
FIG. 10 is a cross-sectional view of the semiconductor structure illustrating deposition of an interlayer dielectric about the nanosheet stack and the dummy gate according to one or more illustrative embodiments.

FIG. 10 illustrates deposition of an inter-layer dielectric (ILD) 126 onto the semiconductor substrate 102 to at least partially encompass the nanosheet stack 104, the S/D regions 124 and the dummy gate 110. In illustrative embodiments, the inter-layer dielectric (ILD) 126 is an oxide layer. In various embodiments, a height of the inter-layer dielectric (ILD) 126 can be reduced by chemical-mechanical polishing (CMP) and/or etching to expose the hard mask and the dummy gate 110. Other suitable dielectric materials for forming the inter-layer dielectric (ILD) 126 include but are not limited to, silicon oxide, silicon nitride, silicon oxynitride, SiCO, SiCON, or any suitable combination of such materials.

Figure 11:
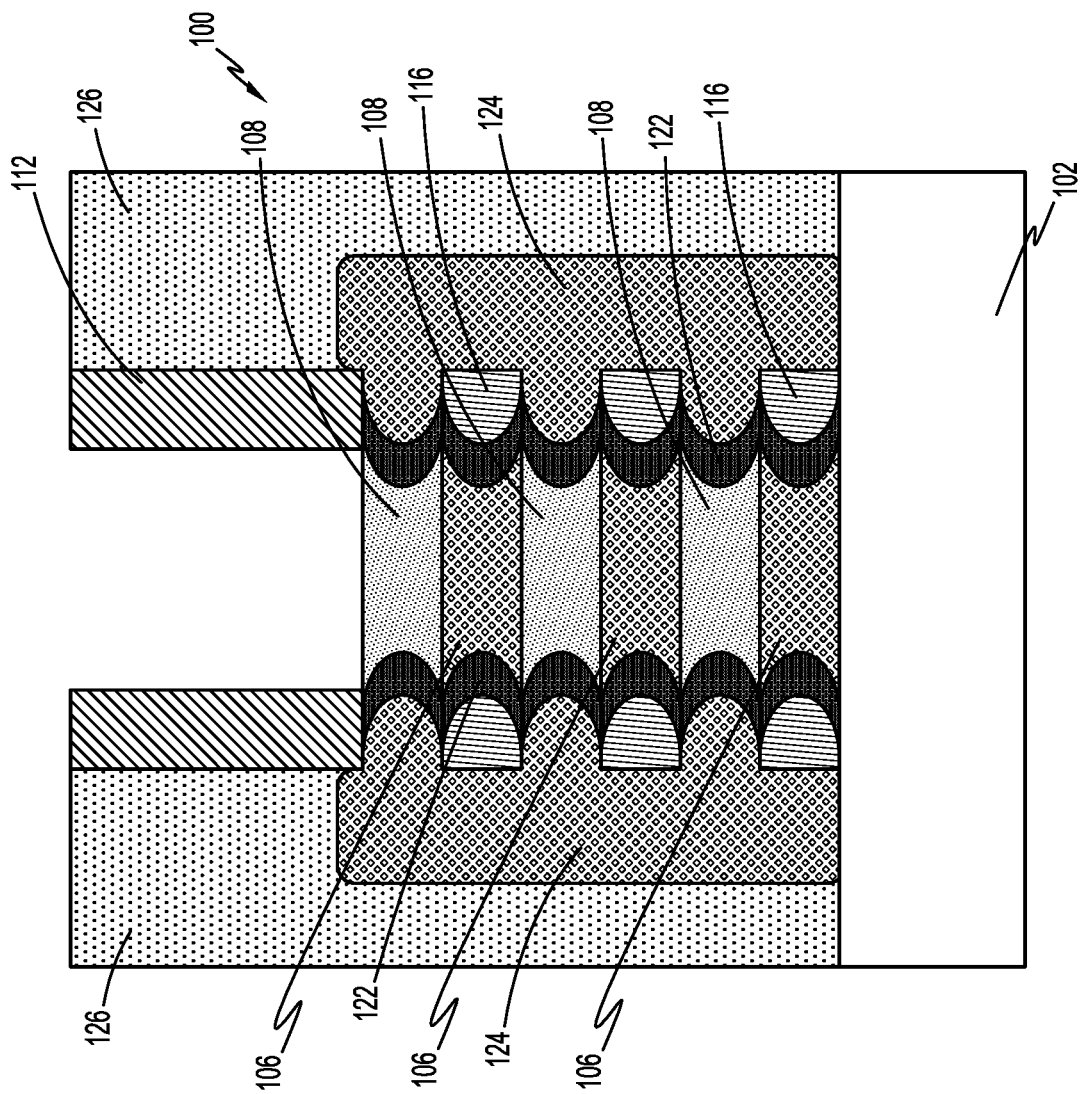
FIG. 11 is a cross-sectional view of the semiconductor structure illustrating removal of the dummy gate according to one or more illustrative embodiments.

Thereafter, the hard mask (not shown) and the dummy gate 110 are removed as shown in FIG. 11. In illustrative embodiments, removal of the dummy gate 110 may be effected using a wet or dry etch process. More specifically, the dummy gate 110 may be removed by at least one of an anisotropic etch process, such as reactive ion etch (RIE), or an isotropic etch process, such as a wet chemical etch, or a combination of both. In one example, the etch process for removing the dummy gate 110 can include an etch chemistry for removing the dummy gate 110 selective to the material layers of the nanosheet stack 104. Upon removal of the dummy gate 110, an opening exposing the underlying nanosheet stack 104 is formed.

Figure 12:
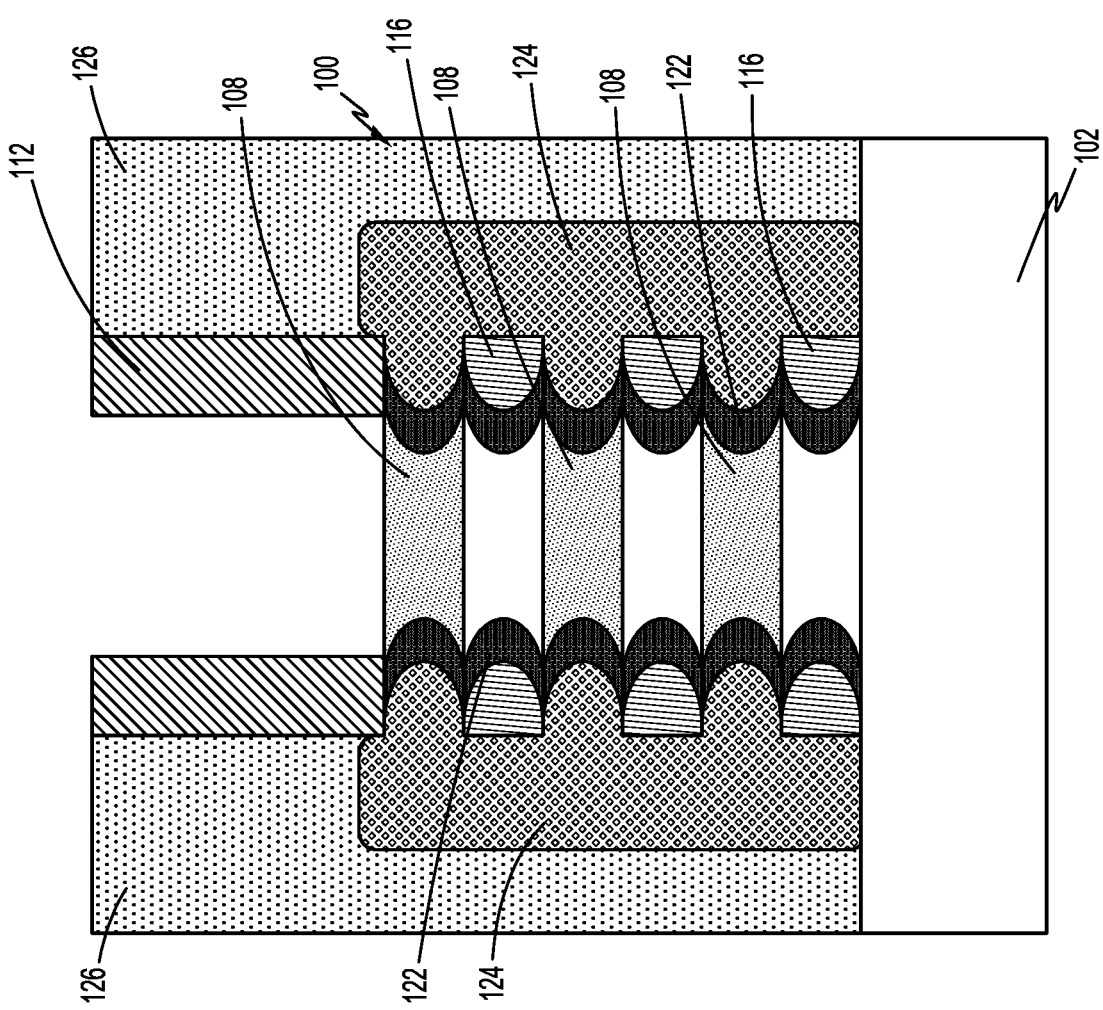
FIG. 12 is a cross-sectional view of the semiconductor structure illustrating removal of the sacrificial nanosheets of the nanosheet stack to release the channel nanosheets according to one or more illustrative embodiments.

Following removal of the dummy gate 110, the sacrificial nanosheets 106 comprising silicon germanium are removed selectively from the channel nanosheets 108 as depicted in FIG. 12 via any suitable etching process, thereby releasing the channel nanosheets 108. During removal of the sacrificial nanosheets 106, the isolation layer 122 of silicon (Si) epi growth protects the epi growth material, i.e., SiGe of the S/D regions 124, substantially minimizing or eliminating any removal of the S/D regions 124. More specifically, the isolation layer 122 and optionally the inner spacers 116 form an isolation barrier preventing the etchant utilized for removal of the silicon germanium (SiGe) sacrificial nanosheets 106 from degrading the silicon germanium (SiGe) of the S/D regions 124. It is noted that the inner spacers 116 although separated from the sacrificial nanosheets 106 are held in place by the gate spacer 112 extending the length of the nanosheet stack 104. The silicon channel nanosheets 108, once released from the silicon germanium sacrificial nanosheets 106 will form the nanosheet channels of the semiconductor device 100 or nanosheet transistor structure. In this example, following removal of one of the sacrificial nanosheets 106, a suspended channel structure is provided. By "suspended channel" it is meant that the channel nanosheets 108 are present overlying the substrate 102. The sidewalls of the channel nanosheets 108 are supported, e.g., anchored, in the gate spacer 112 and by the inner spacers 116. Gate structure materials, electrically conductive materials and/or semiconductor materials may be formed in the space surrounding the suspended structures.

Although FIG. 12 depicts three suspended channel nanosheets 108, the present disclosure is not limited to only this embodiment. Any number of suspended channel nanosheets 108 may be formed using the methods and structures provided by the present disclosure. In illustrative embodiments, the suspended channel nanosheets 108 may be further processed to provide a nanowire geometry. The term "nanosheet" denotes a substantially two-dimensional structure with thickness in a scale ranging from 1 to 100 nm. The width and length dimensions of the nanosheet may be greater than the width dimensions. As used herein, the term "nanowire" describes a structure having a cross-section with a perimeter defined by a curvature, wherein a diameter of the cross-section is less than 1 micron. A nanowire may have an aspect ratio, e.g., height to width ratio, that is approximately 1. In some examples, the cross-section of the nanowire may have a diameter ranging from 1 nm to 40 nm. A nanowire geometry can be produced from the suspended channel nanosheets 108 using etch processing, such as isotropic etch processing.

Figure 13:
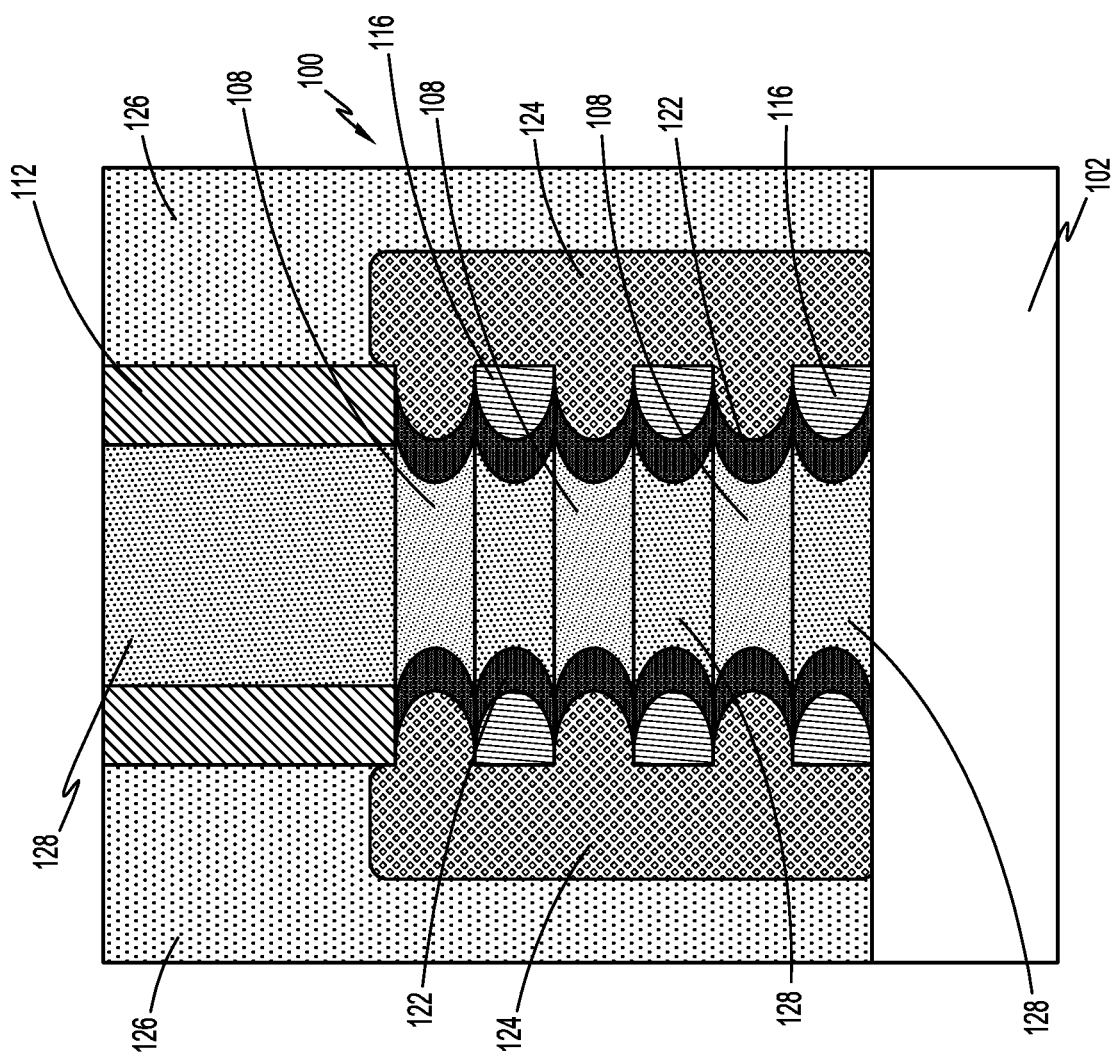
FIG. 13 is a cross-sectional view of the semiconductor structure illustrating deposition of high-k/metal gate according to one or more illustrative embodiments.

Referring now to FIG. 13, the process is continued by forming a high-k/metal gate 128 around the channel nanosheets 108 and within the void left by removal of the dummy gate 110. For example, a high-k dielectric material can be deposited to form a gate dielectric. The gate dielectric can be formed on the entirety of the exterior surface of the suspended channel nanosheets 108. Examples of gate dielectric materials include any suitable dielectric material, including but not limited to silicon oxide, silicon nitride, silicon oxynitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric may further include dopants such as lanthanum, aluminum, magnesium. The gate dielectric material can be formed by any suitable process or any suitable combination of multiple processes, including but not limited to, thermal oxidation, chemical oxidation, thermal nitridation, plasma oxidation, plasma nitridation, atomic layer deposition (ALD), chemical vapor deposition (CVD), etc. In some embodiments, the gate dielectric has a thickness ranging from 1 nm to 5 nm, although less thickness and greater thickness are also envisioned The gate conductor can comprise any suitable conductive material, including, but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. Ti3Al, ZrAl), TaC, TaMgC, carbon nanotube, conductive carbon, graphene, or any suitable combination of these materials. The conductive material may further comprise dopants that are incorporated during or after deposition. In some embodiments, the gate conductor may further comprise a work function setting layer between the gate dielectric and the gate conductor. The work function setting layer can be a work function metal (WFM). WFM can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor and WFM. The gate conductor and WFM can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

In illustrative embodiments, the process may be continued by forming via openings in the inter-layer dielectric (ILD) 126 and depositing electrically conductive material to form contacts (not shown) to the S/D regions 124 of the semiconductor structure 100. The via openings may be formed using pattern and etch processing. The electrically conductive material of the contacts can be tungsten (W), aluminum (Al), copper (Cu), cobalt (Co), nickel (Ni), titanium (Ti), ruthenium (Ru), molybdenum (Mo), or any other suitable conductive material, or a combination thereof. The metal contact can further include a barrier layer. The barrier layer can be titanium nitride (TiN), tantalum nitride (TaN), hafnium nitride (HfN), niobium nitride (NbN), tungsten nitride (WN), tungsten carbon nitride (WCN), or combinations thereof, where the barrier layer can prevent diffusion and/or alloying of the metal contact fill material with the top source drain material, and/or anode/cathode material. In various embodiments, the barrier layer can be deposited in the trench(es) by ALD, CVD, MOCVD, PECVD, or combinations thereof. In various embodiments, the metal fill can be formed by ALD, CVD, and/or PVD to form the electrical contacts.

FIG. 13 depicts one embodiment of a semiconductor device that may include a functional gate structure present on one suspended channel structure of the channel nanosheets 108. A composite spacer comprising a gate spacer 112 extending along a cap portion of the gate structure and the inner spacers 116 along the channel portion of the gate structure. The semiconductor structure 100 may include S/D regions 124 comprising an epitaxial material abutting an outer sidewall of the composite spacer. In embodiments, the epitaxial material is p-doped as part of an pFET semiconductor structure or nanosheet transistor structure, but in other illustrative materials may be n-doped as part of an nFET semiconductor structure or nanosheet transistor structure.

Figure 14:
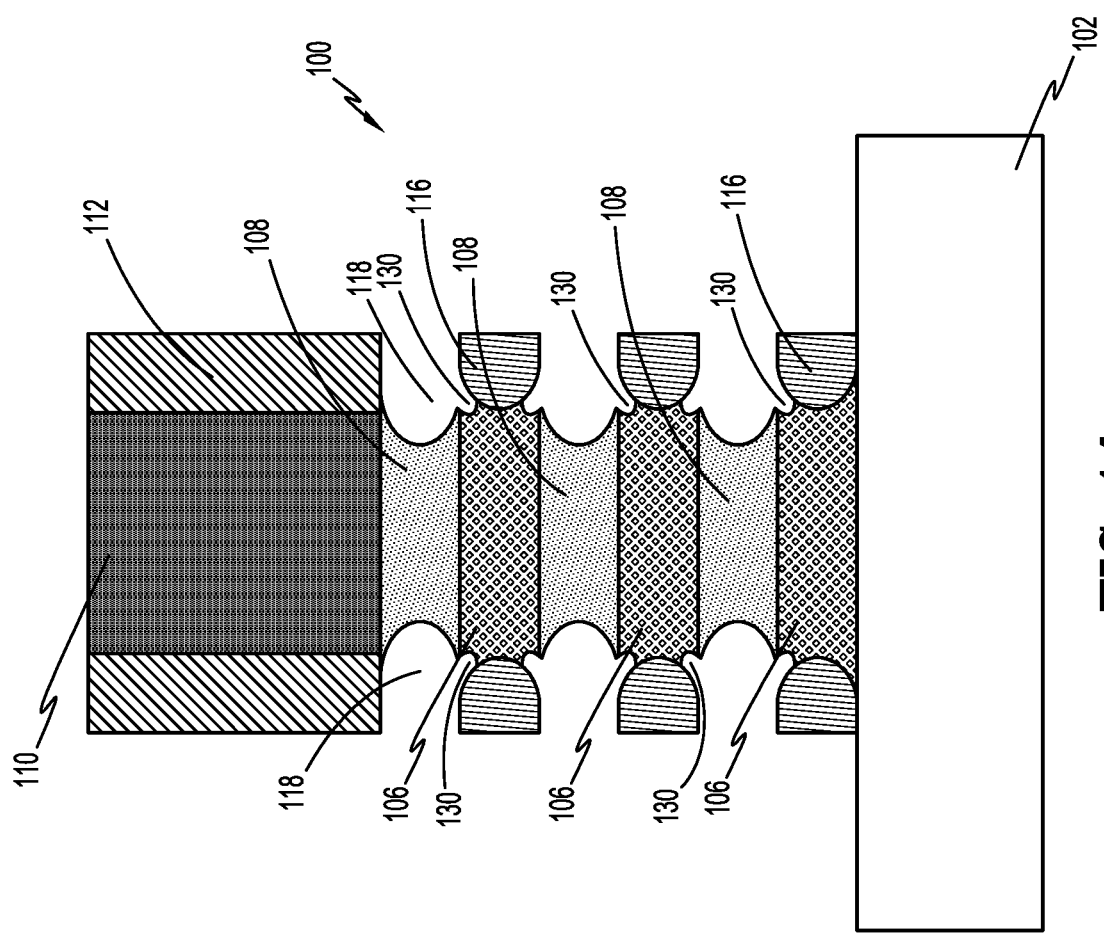
FIG. 14 is a cross-sectional view of another illustrative embodiment of the semiconductor structure illustrating an optional removal of residual material of the sacrificial nanosheets prior to formation of the isolation layer according to one or more illustrative embodiments.
Figure 15:
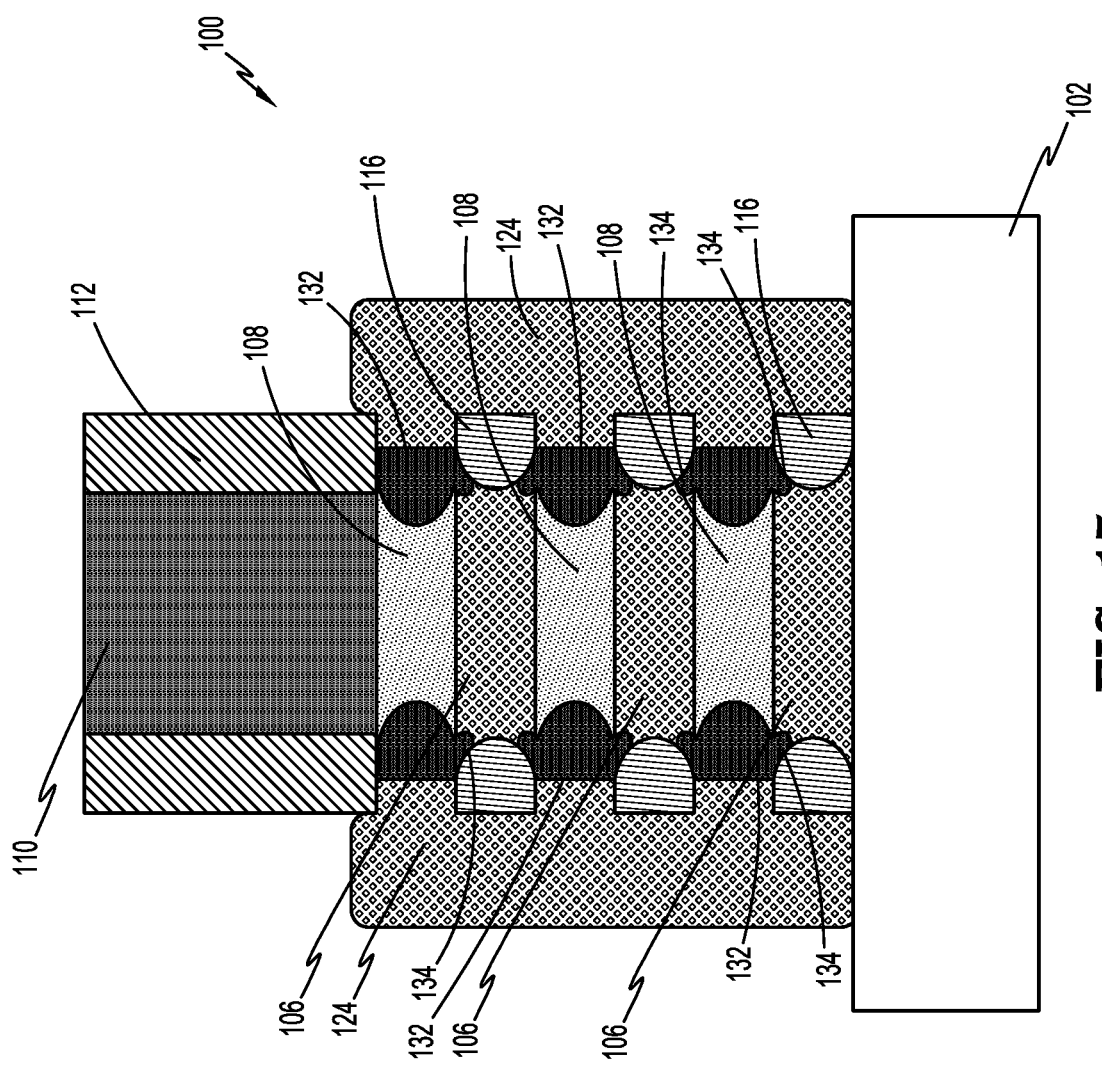
FIG. 15 is a cross-sectional view of the semiconductor structure of FIG. 14 illustrating the isolation layer formed adjacent each of the channel nanosheets and separated by spacers according to one or more illustrative embodiments.

FIGS. 14-15 depict another illustrative embodiment incorporating one or more processing steps to create one or more alternate isolation layers for isolating the S/D regions 124 during removal of the sacrificial nanosheets 106. The process is substantially identical to the process flow depicted in FIGS. 1-6. However, in accordance with this illustrative embodiment, an etching process, for example, a directional etching process is used to remove at least portions of the outer tip segments 106t of the sacrificial nanosheets 106 (FIG. 7) prior to, concurrent with, or subsequent to, creating the channel recesses 118 in the channel nanosheets 108 to form voids 130 within each sacrificial nanosheet 106, e.g., on the bottom and top of the peripheral regions of the sacrificial nanosheets 106. Thereafter, one or more isolation layers is epitaxially grown within the channel recesses 118 of the channel nanosheets 108 to define independent isolation layers 132 aligned with the channel nanosheets 108 and separated by the inner spacers 116. In one illustrative embodiment, the isolation layers 132 comprises doped silicon (Si) epitaxially grown within the channel recesses 118. In illustrative embodiments, the isolation layers 132 fills the channel recesses 118 of the channel nanosheets 108, and also the voids 130 created by the removal of a least a portion of the external regions including the outer tip segments 106t of the sacrificial nanosheets 106. Each isolation layer 132 is crescent shaped but includes at least two opposed wing segments 134 extending from each side of the isolation layer 132 into the voids 130. The top channel nanosheet 108 only includes one wing segment 134. The wing segments 134, in combination with the inner spacers 116, extend to protect or isolate the S/D regions 124 during etch removal of the sacrificial nanosheets 106. More specifically, each of the inner spacers 116 and the individual isolation layers 132 comprises a silicon material which protects or isolates the silicon germanium (SiGe) material of the S/D regions 124 during etching removal of the silicon germanium (SiGe) sacrificial nanosheets 106. In other respects, the illustrative embodiment of FIGS. 14-15 is similar to the illustrative embodiment of FIGS. 1-13.

Figure 16:
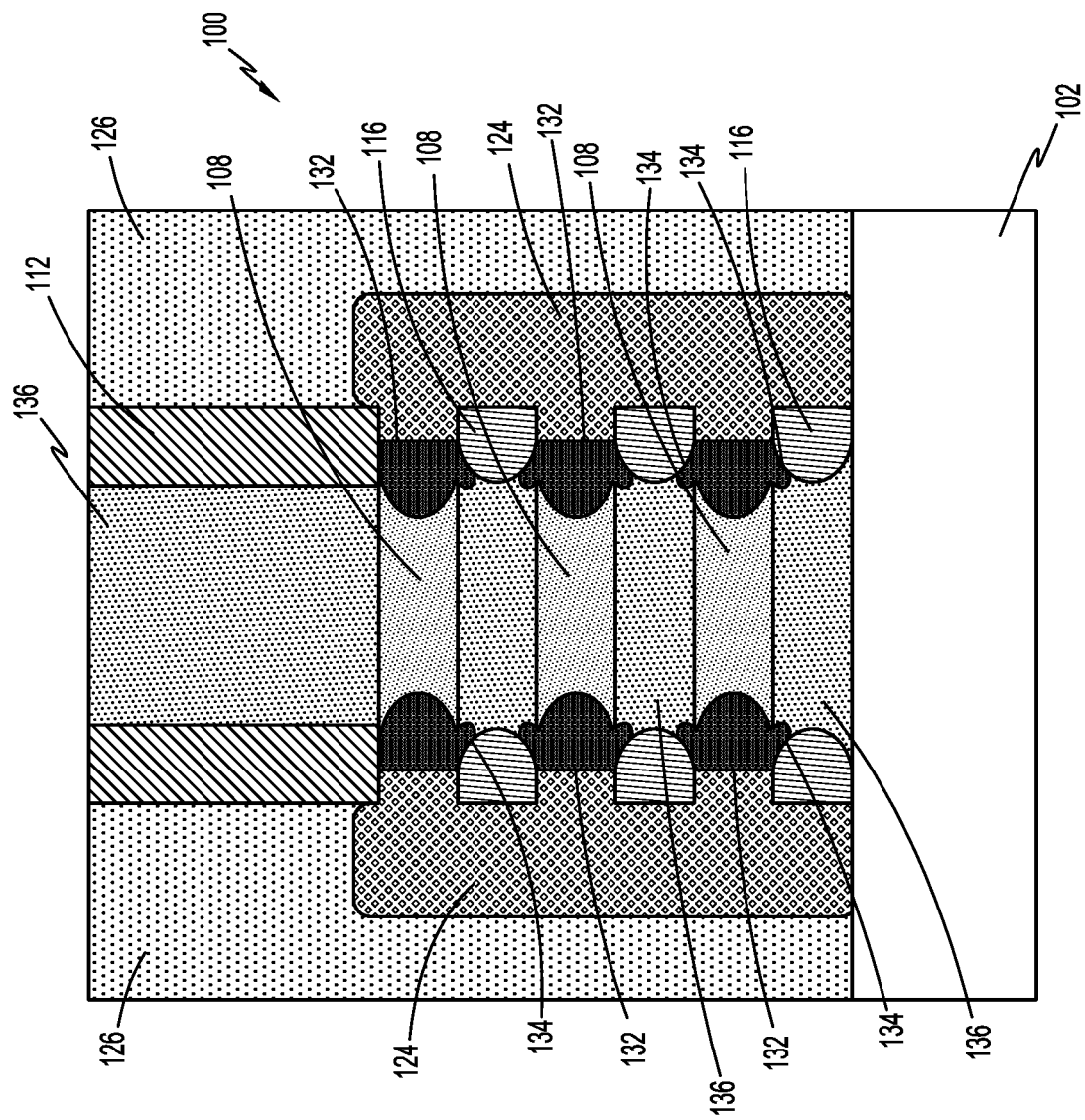
FIG. 16 is a cross-sectional view of the semiconductor structure of FIG. 14 illustrating deposition of high-k/metal gate according to one or more illustrative embodiments.

FIG. 16 depicts deposition of the high k/metal gate 136 subsequent to removal of the dummy gate 110 and the sacrificial nanosheets 106. The growth of the isolation layer 122 and the growth of the S/D regions 124 may be performed in two separate processes. Alternatively, the growth of the isolation layer 122 and the growth of the S/D regions 124 may be performed sequentially in the same epitaxy process.

In some embodiments, the above-described techniques are used in connection with manufacture of semiconductor integrated circuit devices that illustratively comprise, by way of non-limiting example, CMOS devices, MOSFET devices, and/or FinFET devices, and/or other types of semiconductor integrated circuit devices that incorporate or otherwise utilize CMOS, MOSFET, and/or FinFET technology. The disclosed processes provide for the formation of inner spacers and an isolation layer or layers to isolate the source drain regions during etching of the sacrificial nanosheets 106.

Semiconductor devices and methods for forming same in accordance with the above-described techniques can be employed in various applications, hardware, and/or electronic systems, including but not limited to personal computers, communication networks, electronic commerce systems, portable communications devices (e.g., cell and smart phones), solid-state media storage devices, functional circuitry, etc. Given the teachings provided herein, one of ordinary skill in the art will be able to contemplate other implementations and applications of embodiments of the invention.

Accordingly, at least portions of one or more of the semiconductor structures described herein may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

In some embodiments, the suspended nanosheets channel structures may be further processed to provide nanowires. For example, a nanowire geometry can be produced from the suspended channel structures using etch processing, such as isotropic etch processing.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A method, comprising:
  forming a stacked nanosheet structure on a semiconductor substrate, the stacked nanosheet structure comprising a plurality of alternating sacrificial nanosheets and channel nanosheets;
  forming a dummy gate structure about the stacked nanosheet structure;
  forming a spacer within recesses adjacent the outer surface regions of the sacrificial nanosheets;
  removing material within the outer surface regions of the sacrificial nanosheet to define a gap between each spacer and the sacrificial nanosheets;
  epitaxially growing an isolation layer within the gaps defined between the spacers and adjacent outer surface regions of the channel nanosheets;
  forming a source region and a drain region about the stacked nanosheet structure;
  removing the dummy gate;
  removing the sacrificial nanosheets through an etching process whereby at least the isolation material isolates the source region and the drain region from the etching process to provide a nanosheet transistor structure; and forming a functional gate structure in a void created by removal of the dummy gate.

2. The method of claim 1 including removing outer surface regions of the channel nanosheets to define channel recesses therein, and wherein the isolation layer extends within the channel recesses.

3. The method of claim 2 wherein removing the sacrificial nanosheets includes utilizing an etching process selective to the inner spacers and the isolation layer.

4. The method of claim 3 wherein the sacrificial nanosheets comprise silicon and the sacrificial nanosheets comprise silicon germanium.

5. The method of claim 2 wherein epitaxially growing the isolation layer includes forming a plurality of spaced individual isolation layers, adjacent isolation layers being separated by one or more inner spacers, each individual isolation layer being at least partially received within the channel recesses of the nanosheet channels.

6. The method of claim 5 wherein forming the isolation layer includes extending the individual isolation layers to at least partially overlap adjacent sacrificial nanosheets.

7. A semiconductor structure comprising:
a nanosheet structure disposed on a semiconductor substrate, the nanosheet structure comprising a plurality of channel nanosheets, the channel nanosheets each having an outer region defining a channel recess therein;
source and drain regions disposed about the nanosheet structure;
an isolation layer disposed at least partially within each channel recess of the channel nanosheets at least partially between the channel nanosheets and the source and drain regions, at least one isolation layer comprising an arcuate section at least partially disposed within a respective arcuate channel recess of at least one channel nanosheet; and
a functional gate structure disposed about the nanosheet structure.

8. The semiconductor structure of claim 7 including a plurality of inner spacers, individual inner spacers disposed between adjacent channel nanosheets.

9. The semiconductor structure of claim 8 wherein the source region and the drain region each comprise an epitaxial material.

10. The semiconductor structure of claim 9 wherein the semiconductor structure is a component of a p-type transistor.

11. The semiconductor structure of claim 7 wherein each channel recess of the channel nanosheets defines an arcuate-shape.

12. The semiconductor structure of claim 8 wherein the inner spacers each comprise a dielectric material.

13. A semiconductor structure comprising:
a nanosheet structure disposed on a semiconductor substrate, the nanosheet structure comprising a plurality of channel nanosheets;
source and drain regions disposed about the nanosheet structure;
a functional gate structure disposed relative to the nanosheet structure;
an isolation layer at least partially disposed about the nanosheet structure and the functional gate structure; and
one or more inner spacers disposed between the functional gate structure and the source and drain regions, the one or more spacers comprising a dielectric material, the one or more inner spacers each comprising an arcuate section at least partially disposed within one or more corresponding arcuate sections of the isolation layer.

14. The semiconductor structure of claim 13 including a plurality of inner spacers, individual inner spacers disposed between adjacent channel nanosheets.

15. The semiconductor structure of claim 14 wherein the inner spacers are at least partially disposed between the isolation layer and respective ones of the source and drain regions.

16. The semiconductor structure of claim 13 wherein the channel nanosheets each have an outer region defining an arcuate channel recess therein, the isolation layer being at least partially disposed in the arcuate channel recesses.

17. The semiconductor structure of claim 16 wherein each channel nanosheet includes at least one void adjacent each channel recess.

18. The semiconductor structure of claim 17 wherein the isolation layer is further disposed in the at least one void of the channel sheets.

19. The semiconductor structure of claim 13 wherein the semiconductor structure is a component of a p-type transistor.

20. The semiconductor structure of claim 14 wherein the isolation layer is at least partially disposed between the inner spacers and the functional gate structure.

* * * * *